(12) United States Patent
Miwa et al.

(10) Patent No.: US 7,138,670 B2
(45) Date of Patent: Nov. 21, 2006

(54) SEMICONDUCTOR DEVICE FOR USE IN A SOLID STATE IMAGING DEVICE

(75) Inventors: Tetsuya Miwa, Gifu-ken (JP); Tsutomu Imai, Gifu-ken (JP); Seiji Kai, Gifu-ken (JP); Takayuki Kaida, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/040,236

(22) Filed: Jan. 21, 2005

(65) Prior Publication Data

US 2005/0161709 A1    Jul. 28, 2005

(30) Foreign Application Priority Data

Jan. 22, 2004    (JP) ............................. 2004-014678

(51) Int. Cl.
*H01L 29/76*  (2006.01)
*H01L 27/148* (2006.01)
(52) U.S. Cl. ........................ 257/215; 257/213
(58) Field of Classification Search ......... 257/213–224
See application file for complete search history.

(56) References Cited

U.S. PATENT DOCUMENTS 5,227,650 A *  7/1993 Noguchi et al. ............ 257/221

6,784,469 B1 *  8/2004 Yamane et al. ............. 257/222

OTHER PUBLICATIONS

Patent Abstracts of Japan, Publication No. 2001-308313, Publication Date: Nov. 2, 2001, copy of Japanese language patent also enclosed.

* cited by examiner

*Primary Examiner*—Cuong Nguyen
(74) *Attorney, Agent, or Firm*—Fish & Richardson P.C.

(57) ABSTRACT

A compact semiconductor device having a contact hole that improves stability of electric connection between a wire and an electrode. The semiconductor device includes an insulation layer formed on a semiconductor substrate, first electrodes formed on the insulation layer and spaced from one another by an interval, an insulation film covering the first electrodes, and spaced second electrodes formed on the insulation film. Each second electrode includes an intermediate portion filling the space between two adjacent first electrodes, two edge portions respectively laid above the two adjacent first electrodes in an overlapping manner, and an upper surface connected to a wire by a contact. Thickness, t1, of the insulation film, thickness, t2, of each edge portion of the second electrode, and interval, S, between the first electrodes are adjusted to satisfy the expression of $S<(2t1+2t2)$.

5 Claims, 7 Drawing Sheets

SEMICONDUCTOR DEVICE FOR USE IN A SOLID STATE IMAGING DEVICE

CROSS-REFERENCE TO RELATED APPLICATIONS

This application is based upon and claims the benefit of priority from prior Japanese Patent Application No. 2004-014678, filed on Jan. 22, 2004, the entire contents of which are incorporated herein by reference.

BACKGROUND OF THE INVENTION

The present invention relates to a semiconductor device and a method for manufacturing a semiconductor device, and more particularly, to a semiconductor device optimal for use in a transfer section of a solid state imaging device, such as a charge-coupled device (CCD) image sensor, and a method for manufacturing such a semiconductor device.

FIG. 1 is a schematic block diagram of a charge-coupled device (CCD) image sensor in the prior art. In FIG. 1, arrows A1 to A3 show the transfer direction of charges. The image sensor includes an imaging section 101 for performing photoelectric conversion with an optical image of an imaging subject, a storage section 102 for temporarily storing charges to be transferred from the imaging section 101, and a horizontal transfer section 103 for transferring charges from the storage section 102 to an output section 104 (output amplifier).

The imaging section 101 and the storage section 102 each include, for example, a three-phase drive vertical transfer CCD (not shown). Terminals P1 to P3 and C1 to C3 are connected to transfer electrodes of the vertical transfer CCDs. The transfer of charges in the imaging section 101 and the storage section 102 is performed in accordance with three-phase drive pulse signals provided to the terminals P1 to P3 and C1 to C3.

The horizontal transfer section 103 includes, for example, a two-phase drive horizontal transfer CCD (not shown). The terminals H1 and H2 are connected to transfer electrodes of the horizontal transfer CCD. The transfer of charges in the horizontal transfer section 103 is performed in accordance with two-phase drive pulse signals provided to the terminals H1 and H2.

The output section 104 receives charges corresponding to an optical image of the imaging subject and converts the charges to a voltage signal in accordance with the number of charges. An external signal processor (not shown) performs an appropriate signal process on the voltage signal.

FIGS. 2A and 2B schematically show the horizontal transfer section 103. FIG. 2A is a plan view schematically showing part of the horizontal transfer section 103, and FIG. 2B is a cross-sectional view taken along line 2B—2B in FIG. 2A. Arrow A3 in FIG. 2A shows the transfer direction of charges in the same manner as in FIG. 1.

As shown in FIG. 2A, the horizontal transfer section 103 includes first electrodes 22 and second electrodes 24 that are arranged alternately. The first electrodes 22 and the second electrodes 24 function as transfer electrodes of the CCD image sensor. An interlayer insulation film 25 (refer to FIG. 2B) is deposited on the first and second electrodes 22 and 24. Contact holes 25a connected to the second electrodes 24 are formed in the interlayer insulation film 25. The second electrodes 24, which are connected to upper layer wires via the contact holes 25a, are electrically connected to the terminal H1 or H2 (refer to FIG. 1) by the upper layer wires.

As shown in FIG. 2B, the horizontal transfer section 103 includes a semiconductor substrate 20, a plurality of insulation layers 21, a plurality of first electrodes 22 arranged on the insulation layers 21, an insulation film 23, and a plurality of second electrodes 24. The first electrodes 22 and the second electrodes 24 are formed from a conductive material such as N-type polycrystalline silicon. The insulation layers 21 and the insulation film 23 are formed from an insulative material such as silicon oxide.

The first electrodes 22 are formed at the same level above the semiconductor substrate 20. Further, the first electrodes 22 are spaced from one another by a predetermined interval. The insulation film 23 covers the first electrodes 22. The second electrodes 24 are arranged along the first electrodes 22. Each of the second electrodes 24 has an upper surface with a recess. Thus, each second electrode 24 has a U-shaped cross-section. Part of each second electrode 24 is located between the adjacent first electrodes 22, and the remaining part of each second electrode 24 is laid above the corresponding first electrode 22 in an overlapping manner. The insulation film 23 electrically insulates the second electrodes 24 from the first electrodes 22.

The interlayer insulation film 25, which is formed from, for example, silicon oxide, is deposited on the first and second electrodes 22 and 24. The contact holes 25a are formed in the interlayer insulation film 25. More specifically, as shown in FIG. 2B, each contact hole 25a is connected to the generally flat bottom of the recess in the corresponding second electrode 24.

Each contact hole 25a is filled with a wiring material, such as tungsten, to form a contact plug. The contact plug electrically connects the corresponding second electrode 24 and upper layer wire.

Japanese Laid-Open Patent Publication No. 2001-308313 describes an example of a semiconductor device in the prior art.

In recent years, to improve image quality, there is a stronger need to miniaturize pixels of a CCD image sensor. However, when pixels are miniaturized, with the structure of FIG. 2, there is a possibility of the connection between the second electrodes 24 and the upper layer wires being unstable. The reason for such instability will now be discussed with reference to FIG. 3.

FIG. 3 is a schematic cross-sectional view showing a miniaturized horizontal transfer section. The miniaturization of pixels reduces the dimensions of the recesses in the second electrodes 24. As a result, it becomes difficult to connect the contact holes 25a to the recesses of the second electrodes 24.

Furthermore, if the processing accuracy is low in a manufacturing process, such as photolithography, a contact hole 25a may be connected to an inclined portion in the upper surface of the corresponding second electrode 24. When such a contact hole 25a is formed by etching the interlayer insulation film 25, there is a risk of the second electrode 24 being over-etched. The broken lines in FIG. 3 show over-etched second electrodes 24.

Additionally, as shown in FIGS. 2B and 3, in the prior art structure, steps St are formed in the interlayer insulation film 25 in correspondence with the shape of lower members. Steps St are also formed above the second electrodes 24. During the lithography process, the steps St remain even after applying a resist to the interlayer insulation film 25. Thus, referring to FIG. 2B, during the formation of the contact holes 25a, the thickness of the resist may be uneven, and light reflection at the interface between the interlayer insulation film 25 and the resist may vary the amount of exposure. This may result in the contacts holes 25a being formed as deficient holes, with, for example, the contact holes 25a having different dimensions.

SUMMARY OF THE INVENTION

One aspect of the present invention is a semiconductor device including a semiconductor substrate. An insulation layer is formed on the semiconductor substrate. A plurality of first electrodes are formed on the insulation layer and spaced from one another by an interval, S. An insulation film covers the first electrodes. A plurality of second electrodes are formed on the insulation film and spaced from one another by another interval. Each second electrode includes an intermediate portion filling the space between two adjacent first electrodes and two edge portions respectively laid above the two adjacent first electrodes in an overlapping manner. Thickness, t1, of the insulation film, thickness, t2, of each edge portion of the second electrode, and the interval S between the first electrodes satisfy the expression of $S<(2t1+2t2)$.

Another aspect of the present invention is a method for manufacturing a semiconductor device. The method includes forming an insulation layer on a semiconductor substrate, forming a plurality of first electrodes on the insulation layer spaced from one another by an interval, S, forming an insulation film covering the first electrodes, and forming a plurality of second electrodes on the insulation film and spaced from one another by another interval. Each second electrode includes an intermediate portion filling the space between two adjacent first electrodes and two edge portions respectively laid above the two adjacent first electrodes in an overlapping manner. The method further includes adjusting thickness, t1, of the insulation film, thickness, t2, of each edge portion of the second electrode, and the interval S between the first electrodes to satisfy the expression of $S<(2t1+2t2)$.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiment together with the accompanying drawings in which.

DETAILED DESCRIPTION OF THE PREFERRED EMBODIMENT

A semiconductor device and a method for manufacturing a semiconductor device according to a preferred embodiment of the present invention will now be described. The semiconductor device of the preferred embodiment is a CCD image sensor that retrieves electric signals (image signals) corresponding to an optical image of an imaged subject. In a preferred embodiment, the horizontal transfer section has a structure as shown in FIGS. 4A to FIG. 4C so as to prevent over-etching and prevent the formation of deficient holes.

The structure of the horizontal transfer section in the CCD image sensor of the preferred embodiment will now be described with reference to FIGS. 4A to 4C. FIG. 4A is a partial plan view showing the horizontal transfer section of the CCD image sensor. In FIG. 4A, region R1 is where charges are not transferred in the horizontal transfer section, and region R2 is where charges are transferred. Further, in FIG. 4A, arrow A3 shows the transfer direction of charges.

Figure 4A:
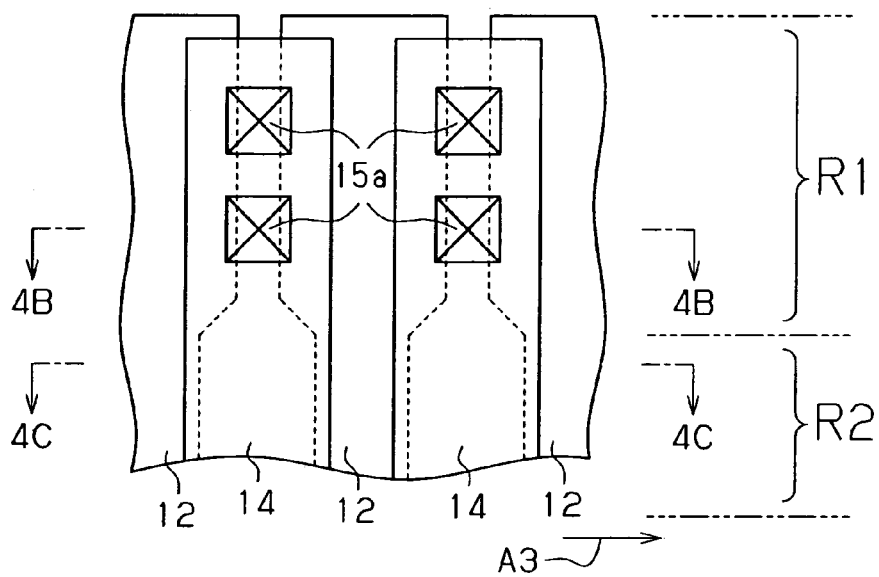
FIG. 4A is a schematic, partial plan view showing a semiconductor device according to a preferred embodiment of the present invention.
Figure 4B:
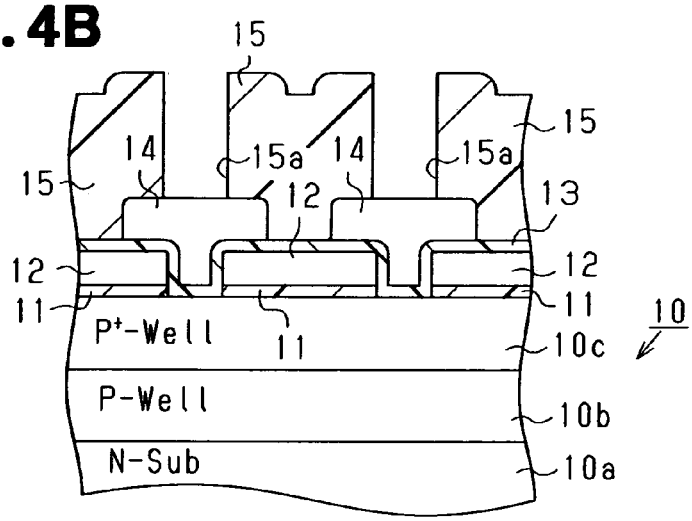
FIG. 4B is a cross-sectional diagram taken along line 4B—4B in FIG. 4A.
Figure 4C:
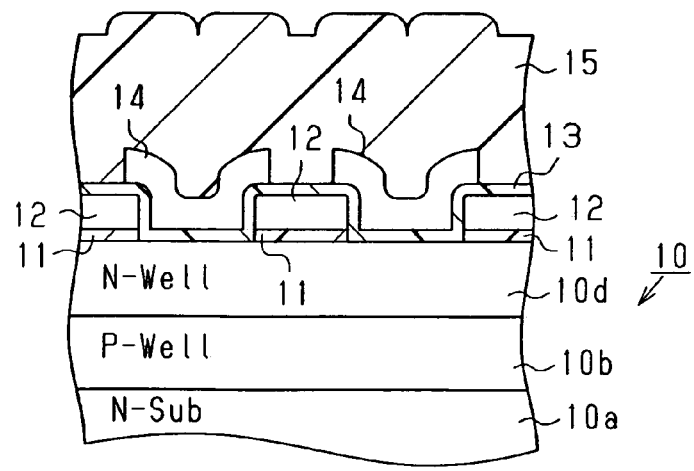
FIG. 4C is a cross-sectional diagram taken along line 4C—4C in FIG. 4A.

As shown in FIG. 4A, the horizontal transfer section includes alternately arranged first electrodes 12 and second electrodes 14. An interlayer insulation film 15 is deposited on the electrodes 12 and 14. Contact holes 15a connected to the second electrodes 14 are formed in the interlayer insulation film 15. The contact holes 15a electrically connect the second electrodes 14 to upper layer wires.

Charges are not transferred in the region R1 of the horizontal transfer section. Adjacent first electrodes 12 are located near each other in the region R1. The contact holes 15a are formed in the region R1. Accordingly, the contact holes 15a formed in the upper surface of the second electrodes 12 are overlapped with parts of the first electrodes 12, which are located near each other. Contact holes connected to the first electrodes 12 may also be formed in the region R1.

As shown in FIG. 4B, in the region R1, the horizontal transfer section includes a semiconductor substrate 10 formed from, for example, silicon, insulation layers 11 arranged on the semiconductor substrate 10 and formed from, for example, silicon oxide, the first electrodes 12 formed from, for example, N-type polycrystalline silicon, an insulation film 13 formed from, for example, silicon oxide, and the second electrodes 14 formed from, for example, N-type polycrystalline silicon. The semiconductor substrate 10 has a three-layer structure formed by superimposing an N-type semiconductor substrate 10a, a P-well 10b, and a $P^+$-well, which is doped with impurities having a higher concentration than the P-well 10b.

Figure 6:
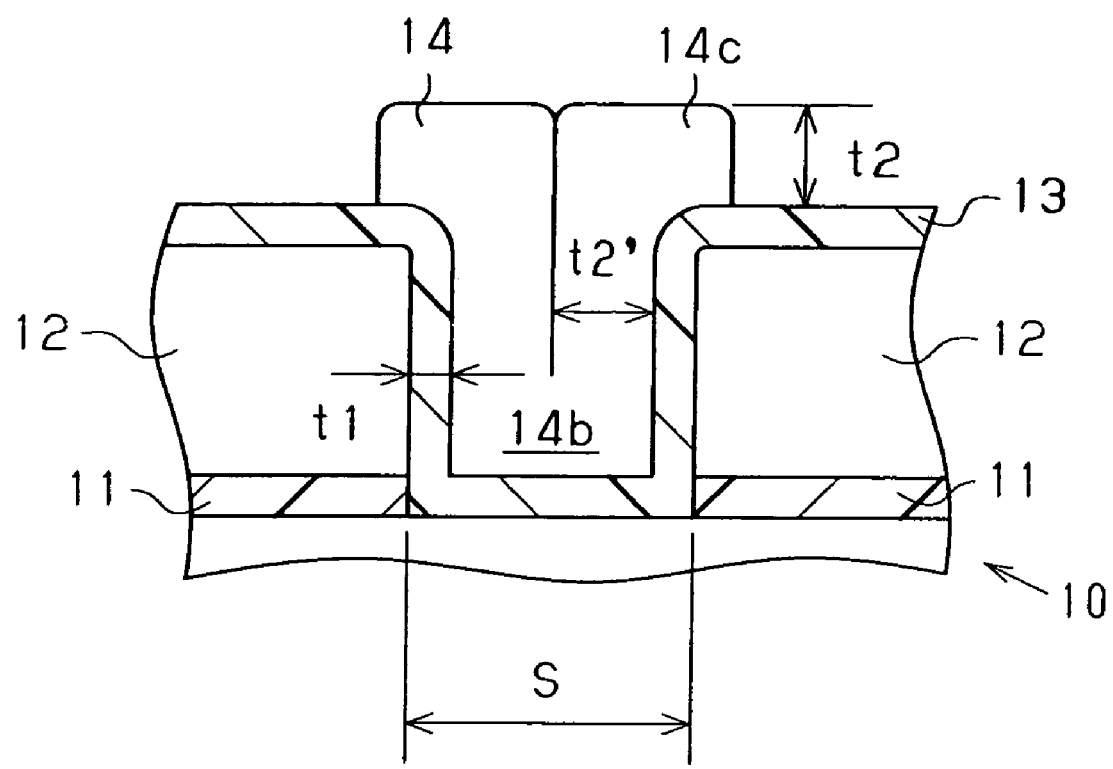
FIG. 6 is a partial cross-sectional diagram showing a semiconductor device according to a preferred embodiment of the present invention.

The first electrodes 12, which are arranged on the insulation layers 11 above the semiconductor substrate 10, are spaced from one another by a predetermined interval. The insulation film 13 covers the first electrodes 12. The second electrodes 14 are arranged along the first electrodes 12. The insulation film 13 electrically insulates the second electrodes 14 from the first electrodes 12. As shown in FIG. 6, each second electrode 14 includes an intermediate portion 14b, which is arranged between the adjacent first electrodes 12, and edge portions 14c, which are laid above the corresponding first electrode 12 in an overlapping manner. In each second electrode 14, the edge portions 14c are formed continuously from the intermediate portion 14b.

As shown in FIG. 4B, each second electrode 14 has a T-shaped cross-section in the region R1. In other words, each second electrode 14 has a generally flat upper surface. As shown in FIG. 4C, each second electrode 14 has a Y-shaped cross-section in the region R2.

The interlayer insulation film 15, which is formed from, for example, silicon oxide, is deposited on the electrodes 12 and 14. The contact holes 15a are formed in the interlayer insulation film 15. As shown in FIG. 4B, each contact hole 15a is connected to an adjacent second electrode 14. More specifically, as shown in FIG. 4B, each contact hole 15a is connected to the generally flat surface of a second electrode 14. The contact hole 15a is filled with a wiring material, such as tungsten, to form a contact plug. The contact plug electrically connects the corresponding second electrode 14 and upper layer wire.

Each second electrode 14 has a flat upper surface (contact surface). Thus, the interlayer insulation film 15 deposited on the first electrodes 12 and the second electrodes 14 is sufficiently (substantially) flat above the contact surface of each second electrode 14.

In the prior art, the steps St in the surface of the interlayer insulation film 25 resulted in contact holes having different dimensions and caused deficient holes. However, the semiconductor device of the present embodiment prevents the occurrence of such problems. Further, the structure of each second electrode 14 increases the freedom of design. Additionally, the necessary area for the contact surface in each second electrode 14 is ensured even if the semiconductor device is miniaturized. This prevents the problem of the prior art from occurring in which the second electrodes are over-etched. In this manner, in the semiconductor device of the preferred embodiment, the contact holes 15a improve the stability of electric connection between the second electrodes 14 and wires.

Figure 1:
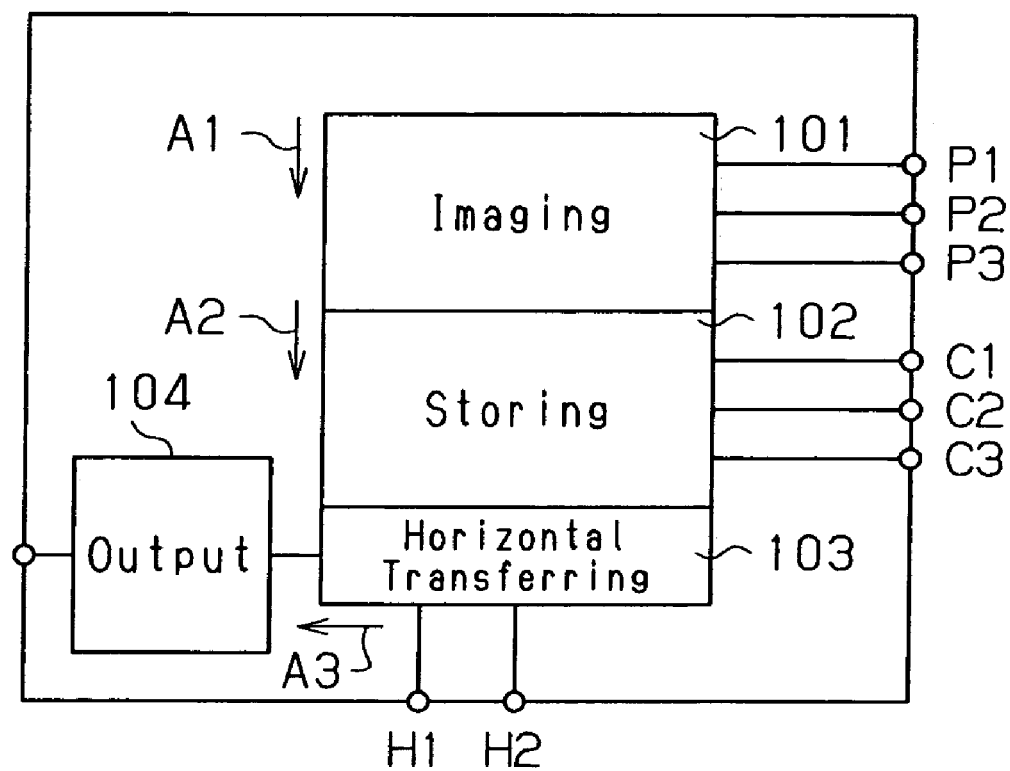
FIG. 1 is a schematic block diagram of a prior art semiconductor device.
Figure 2A:
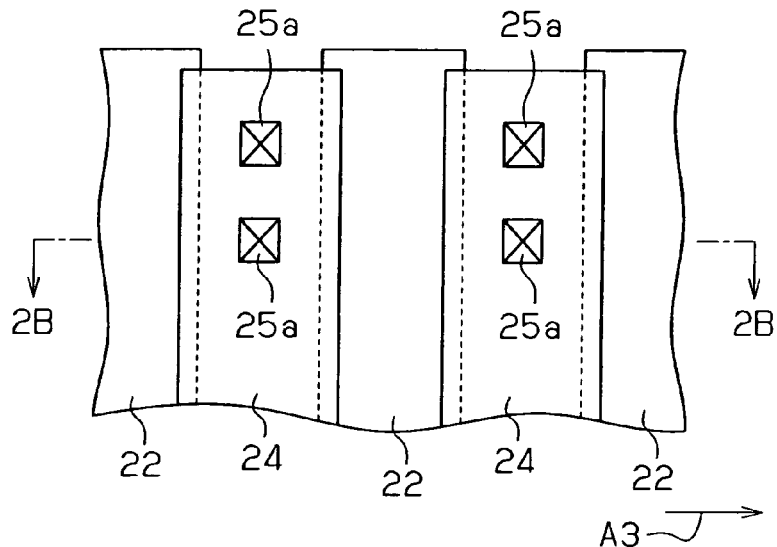
FIG. 2A is a schematic plan view showing the prior art semiconductor device.
Figure 2B:
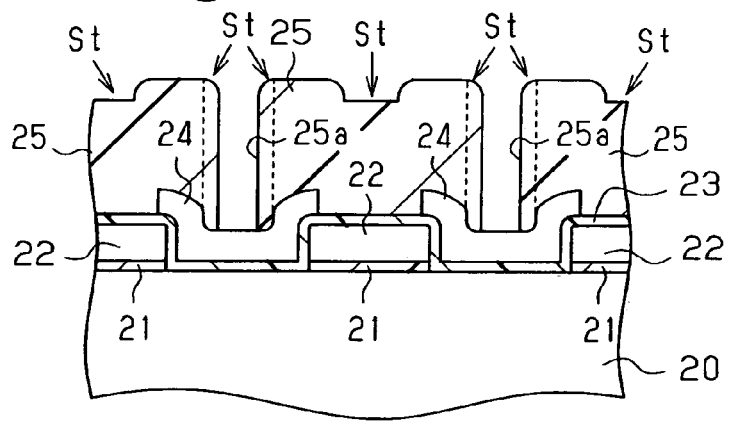
FIG. 2B is a cross-sectional view taken along line 2B—2B in FIG. 2A.
Figure 3:
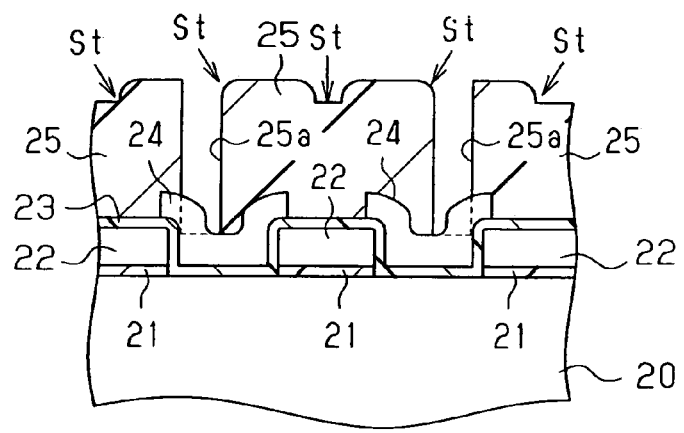
FIG. 3 is a schematic cross-sectional diagram of a prior art semiconductor device.

As shown in FIG. 4C, in the region R2, where charges are transferred, the horizontal transfer section has a cross-section that is similar to that of the prior art transfer section shown in FIG. 2B. However, in the horizontal transfer section of the preferred embodiment, the contact holes 15a are formed in the region R1 and not in the region R2. In the region R2, the semiconductor substrate 10 has a three-layer structure formed by superimposing the N-type semiconductor substrate 10a, the P-well 10b, and the N-well 10d. The P+-well 10c and the N-well 10d form a PN bond at the interface of the region R1 and the region R2. This prevents leak current between the regions R1 and R2.

The procedure for manufacturing the semiconductor device of the preferred embodiment will now be described with reference to FIGS. 5A to 5I.

Figure 5A:
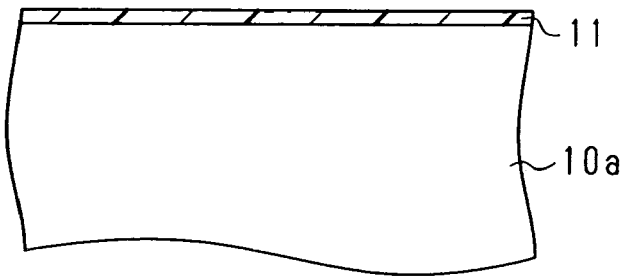
FIGS. 5A to 5I are cross-sectional views showing procedures for manufacturing a semiconductor device according to a preferred embodiment of the present invention.
Figure 5B:
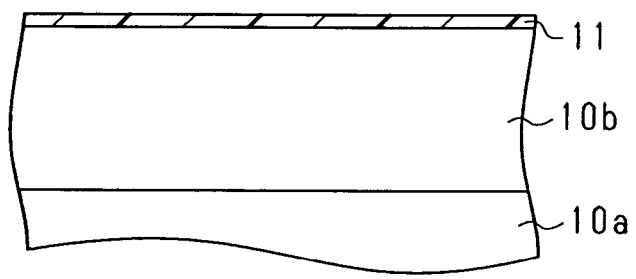
Figure 5C:
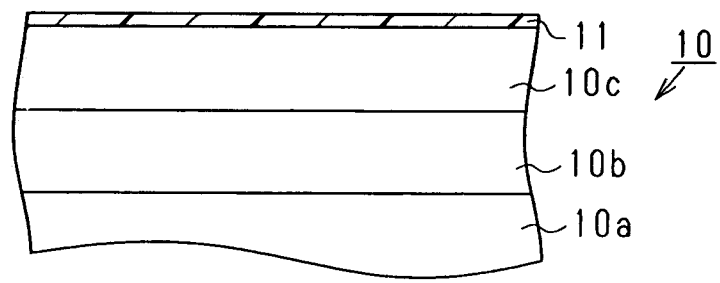

First, referring to FIG. 5A, the insulation layer 11 is formed by performing, for example, thermal oxidization on the N-type semiconductor substrate 10a, which is formed from, for example, N-type silicon. Referring to FIG. 5B, the N-type semiconductor substrate 10a is doped with P-type impurities such as boron (B) to form the P-well 10b. Referring to FIG. 5C, the P-well 10b is doped with P-type impurities having a concentration higher than the P-type impurities doped to the N-type semiconductor substrate 10a. This forms the semiconductor substrate 10 with a three-layer structure. The semiconductor substrate 10a and the well 10b are doped with p-type impurities by performing ion implantation.

In the region R2 (refer to FIG. 4A), the P-well 10b is doped with N-type impurities, such as phosphor (P), to form the N-well 10d.

Figure 5D:
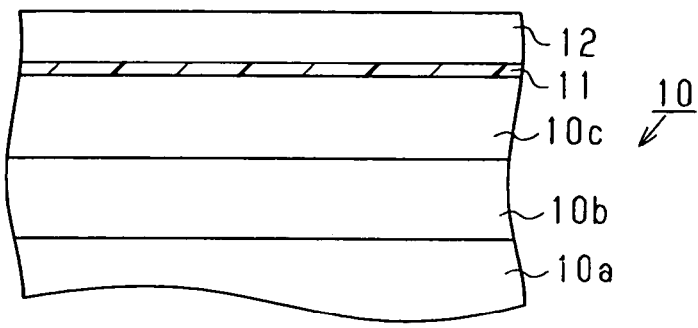
Figure 5E:
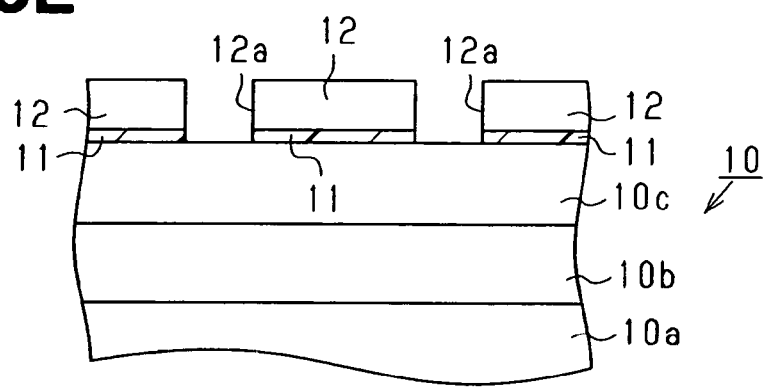

Referring to FIG. 5D, a polycrystalline silicon film (e.g., N-type) 12, which functions as the material of the first electrodes, is formed on the insulation layer 11. The polycrystalline silicon film 12 is formed by performing low pressure chemical vapor deposition (LP-CVD). Further, the polycrystalline silicon film 12 is doped with N-type impurities such a phosphor. The doping may be performed through heat dispersion. Subsequently, referring to FIG. 5E, the insulation layer 11 and the polycrystalline silicon film 12 are selectively etched to form a plurality of openings, or grooves 12a. The grooves 12a define the first electrodes 12.

Figure 5F:
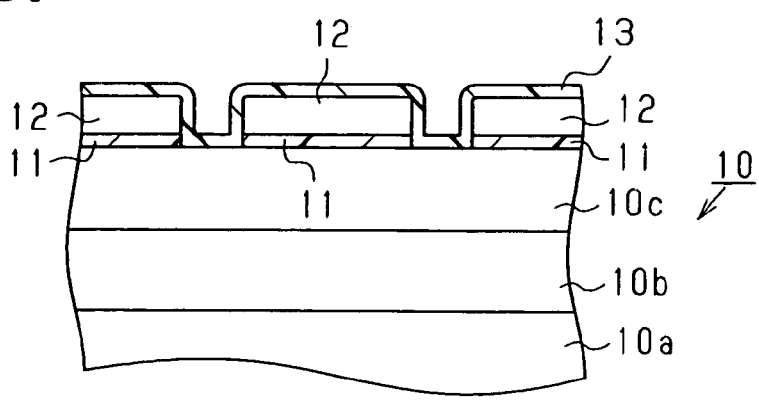
Figure 5G:
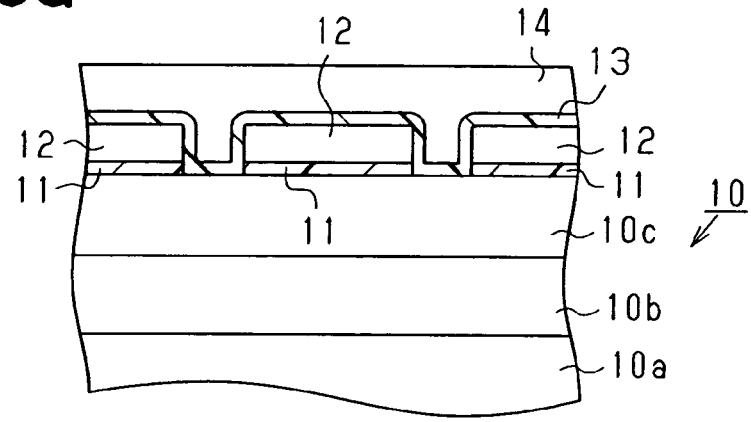
Figure 5H:
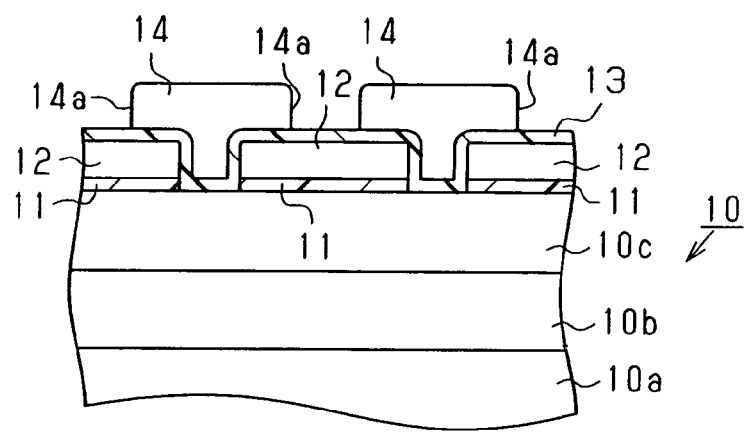

Referring to FIG. 5F, the insulation film 13 is formed on the semiconductor substrate 10 that includes the surface of the first electrodes 12 by performing, for example, thermal oxidization. Referring to FIG. 5G, a polycrystalline silicon film (e.g., N-type) 14, which functions as the material of the second electrodes, is formed on the insulation film 13. The polycrystalline silicon film 14 is formed by performing LP-CVD. Referring to FIG. 5H, the polycrystalline silicon film 14 is selectively etched to form a plurality of openings 14a. The openings 14a define the second electrodes 14.

Figure 5I:
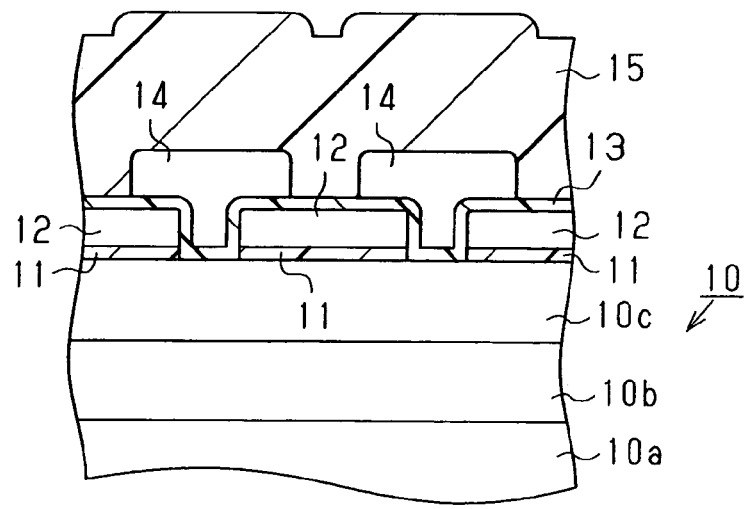

Referring to FIG. 5I, the interlayer insulation film 15 is formed on the first electrodes 12 and the second electrode 14. The interlayer insulation film 15 is formed by performing plasma chemical vapor deposition (CVD). The interlayer insulation film 15 is selectively etched to form the contact holes 15a. This completes the structure shown in FIG. 4B.

In the preferred embodiment, to shape the second electrodes 14 as shown in FIG. 4B, the dimensions of the first electrodes 12, the insulation film 13, and the second electrodes 14 are determined to satisfy a predetermined relationship. More specifically, the interval S between adjacent first electrodes 12, the thickness t1 of the insulation film 13 formed between the first electrodes 12 and the second electrodes 14, and the thickness t2 of the second electrodes 14 formed above the first electrodes 12 are determined to satisfy the following expression.

$$S<(2t1+2t2)$$

The setting of the dimensions for the first and second electrodes 12 and 14 and the insulation film 13 will now be described in detail with reference to FIG. 6. FIG. 6 shows the cross-sectional structure of the horizontal transfer section when the dimensions satisfy the above expression. Dimension t2' is the thickness of the second electrodes 14 formed between the first electrodes 12. In the following description, it is presumed that in between the first electrodes 12 (in the grooves 12a) and above the first electrodes, the second electrodes 14 and the insulation film 13 have an even thickness.

In the horizontal transfer section of FIG. 6, the gaps (grooves 12a) between adjacent first electrodes 12 are filled with the second electrodes 14 and the insulation film 13. Further, each second electrode 14 has a T-shaped cross-section. More specifically, when the interval S between the first electrodes 12 is narrowed and the interval S becomes equal to the sum of two times the thickness t1 of the insulation film 13 (2t1) and two times the thickness t2 of the second electrodes 14 (2t2), the gaps (grooves 12a) between the first electrodes 12 are filled with the second electrodes 14 and the insulation film 13. Further, in this state, each second electrode 14 has a T-shaped cross-section.

However, during normal manufacturing procedures (under normal manufacturing conditions), the film growth rate (formation rate) differs between a surface orthogonal to the semiconductor substrate 10 (e.g., side surface of the first electrode 12) and a surface parallel to the semiconductor substrate 10 (e.g., upper surface of the first electrode 12). Thus, it is rare for the second electrodes 14 and the insulation film 13 to have an even thickness at portions located in the gaps between the first electrodes 12 and portions located above the first electrodes 12. The thickness of the second electrodes 14 normally satisfies the expression of t2≧t2'. That is, the gaps between adjacent first electrodes 12 are not always filled with the second electrodes 14 and the insulation film 13 just by setting the dimensions of the first and second electrodes 12 and 14 and the insulation film 13 to satisfy the equation of S=(2t1+2t2). In the preferred embodiment, the interval (S) between the first electrodes 12 is narrower than (2t1+2t2). This ensures that the gaps between the first electrodes 12 are satisfied between the second electrodes 14 and the insulation film 13. Thus, in the preferred embodiment, each second electrode 14 has a T-shaped cross-section.

In this manner, the dimensions of the first and second electrodes 12 and 14 and the insulation film 13 are determined to satisfy the expression of S<(2t1+2t2). This enables the edge portions 14c of the second electrodes 14 to become plate-shaped and substantially parallel to the semiconductor substrate 10 in a single process (FIG. 5G).

The preferred embodiment has the advantages described below.

(1) The second electrodes 14 are arranged so that part of each second electrode 14 is located between the first electrodes 12 via the insulation film 13, which is formed on the surface of the first electrodes 12, and the remaining part of each second electrode 14 is located above the first electrodes 12. The upper surfaces of the second electrodes 14 are connected to the upper layer wires by the contact holes 15a. Further, each second electrode 14 has a T-shaped cross-section. This ensures stable electric connection of the transfer electrodes in the CCD image sensor.

(2) The first and second electrodes 12 and 14 and the insulation film 13 are formed so that the thickness t1 of the insulation film 13 between the first electrodes 12, the thickness t2 of the second electrodes 14, and the interval S between the first electrodes 12 satisfies the expression of S<(2t1+2t2). This forms the second electrodes 14, with the edge portions 14c substantially parallel to the semiconductor substrate 10, in a single process.

(3) The first electrodes 12 and the second electrodes 14 extend from the transfer electrodes. Further, the contact holes 15a are formed in the horizontal transfer section at portions where charges are not transferred (region R1). The interval S of the first electrodes 12 is locally narrowed in the region R1. This prevents or suppresses a decrease in the transfer efficiency of charges even if the dimensions of the first electrodes 12 and the second electrodes 14 differ from that of the transfer electrodes. Further, the manufacturing of the first electrodes 12 and the second electrodes 14 is relatively simple.

It should be apparent to those skilled in the art that the present invention may be embodied in many other specific forms without departing from the spirit or scope of the invention. Particularly, it should be understood that the present invention may be embodied in the following forms.

In the present invention, the semiconductor substrate 10 has a different structure in the region R1 and the region R2. Further, the P⁺-well 10c of the region R1 and the N-well 10d of the region R2 are PN bonded in the interface therebetween. This prevents leak current between the regions R1 and R2. However, the semiconductor substrate 10 is not limited to this structure. For example, the region R1 and the region R2 may have the same structure. Further, the semiconductor substrate 10 does not necessarily have to have a three-layer structure and may have a structure including any number of layers, for example, one layer, two layers, or four or more layers.

In the preferred embodiment, the contact holes 15a are formed in the horizontal transfer section at portions where charges are not transferred (region R1), and the interval of the first electrodes 12 are locally narrowed in that portion. However, the present invention is not limited to such a structure. For example, the contact holes 15a may be formed in portions where charges are transferred (region R2). That is, a transfer electrode of the CCD image sensor formed in the region R2 may have a T-shaped cross-section.

In the preferred embodiment, polycrystalline silicon is used as the material of the first electrodes 12 and the second electrodes 14 in the preferred embodiment. However, the material of the electrodes is not limited to polycrystalline silicon. For example, other conductive materials, such as metal, may be used. Further, the material of the insulation layers 11 and the insulation film 13 is not limited to silicon oxide. For example, an insulation material, such as silicon nitride, may be used. The insulation layers 11 and the insulation film 13 may be a multilayer structure including various types of insulation films.

The horizontal transfer CCD in the horizontal transfer section may be driven in any manner. When charges are transferred using a two-phase drive technique, in the region R2 (refer to FIG. 4A), for example, the semiconductor substrate is to be doped with impurities by performing ion implantation to selectively form an impurity region under the first electrode 12 or the second electrode 14.

The present invention is applied to a transfer section of a solid state imaging device and has an effective structure. However, the present invention is not limited to a horizontal transfer CCD of a horizontal transfer section. For example, the present invention may be applied to a vertical transfer CCD in an imaging section or a storage section. Alternatively, the present invention may be applied to a semiconductor device other than a solid state imaging device.

The semiconductor device may be manufactured in any manner as long as the second electrodes 14 arranged in correspondence with the first electrodes 12 have a T-shaped cross-section.

The present examples and embodiment are to be considered as illustrative and not restrictive, and the invention is not to be limited to the details given herein, but may be modified within the scope and equivalence of the appended claims.

What is claimed is:

1. A semiconductor device comprising:
a semiconductor substrate;
an insulation layer formed on the semiconductor substrate;
a plurality of first electrodes formed on the insulation layer and spaced from one another by an interval, S;
an insulation film covering the first electrodes; and
a plurality of second electrodes formed on the insulation film and spaced from one another by another interval, each second electrode including an intermediate portion filling the space between two adjacent electrodes and two edge portions respectively laid above the two adjacent first electrodes in an overlapping manner, wherein thickness, t1, of the insulation film, thickness, t2, of each edge portion of the second electrode, and the interval S between the first electrodes satisfy the expression of $$S < (2t_1 + 2t_2)$$

wherein each of the first electrodes includes a portion that locally narrows space form an adjacent one of the first electrodes, wherein each of the second electrodes includes an upper surface connected to a wire by a contact and the contact is connected to a portion of the upper surface of the second electrode, the portion being laid over the locally narrowed portion of the first electrodes.

2. The semiconductor device according to claim 1, wherein the semiconductor device is a solid state imaging device, and the first electrodes and the second electrodes are transfer electrodes of the solid state imaging device.

3. The semiconductor device according to claim 1, wherein the first electrodes and the second electrodes are formed from polycrystalline silicon.

4. The semiconductor device according to claim 1, further comprising:
   an insulation film covering the second electrodes, the insulation film including a contact hole connected to the upper surface of each second electrode and filled with an electrically conductive material that forms the contact.

5. The semiconductor device according to claim 4, wherein each of the second electrodes includes a flat upper surface, and the contact is connected to the flat upper surface of the second electrode.

* * * * *